(12) United States Patent
Li

(10) Patent No.: US 8,742,267 B2
(45) Date of Patent: Jun. 3, 2014

(54) ELECTROMAGNETIC INTERFERENCE SHIELDING ASSEMBLY AND ELECTRONIC DEVICE HAVING SAME

(75) Inventor: Hong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/596,061

(22) Filed: Aug. 28, 2012

(65) Prior Publication Data

US 2013/0319751 A1    Dec. 5, 2013

(30) Foreign Application Priority Data

May 29, 2012 (CN) .......................... 2012 1 0170689

(51) Int. Cl.
*H05K 9/00* (2006.01)
(52) U.S. Cl.
USPC .......................................... 174/383; 174/384
(58) Field of Classification Search
USPC ........................... 174/382, 383, 384; 361/816
See application file for complete search history.

(56) References Cited

U.S. PATENT DOCUMENTS

| | | | | |
|---|---|---|---|---|
| 5,349,132 | A * | 9/1994 | Miller et al. .................. | 174/372 |
| 6,162,989 | A * | 12/2000 | Garner .......................... | 174/358 |
| 6,621,717 | B2 * | 9/2003 | Tuttle et al. ................... | 361/818 |
| 6,627,811 | B2 * | 9/2003 | Rubenstein et al. .......... | 174/376 |
| 6,639,144 | B1 * | 10/2003 | Toh ................................ | 174/350 |
| 6,672,902 | B2 * | 1/2004 | Skinner et al. ........... | 439/607.01 |
| 7,177,161 | B2 * | 2/2007 | Shima .......................... | 361/816 |
| 7,760,515 | B2 * | 7/2010 | Sun ............................... | 361/818 |
| 7,994,434 | B2 * | 8/2011 | Benner et al. ................. | 174/360 |
| 8,514,589 | B2 * | 8/2013 | Mikami ........................ | 361/825 |
| 2003/0111242 | A1 * | 6/2003 | Radu et al. .................... | 174/350 |
| 2011/0180314 | A1 * | 7/2011 | Pedoeem et al. ............. | 174/377 |
| 2011/0242788 | A1 * | 10/2011 | Jaze et al. ..................... | 361/818 |

\* cited by examiner

*Primary Examiner* — Hung Ngo
(74) *Attorney, Agent, or Firm* — Novak Druce Connolly Bove + Quigg LLP

(57) ABSTRACT

An electromagnetic interference shielding assembly for use in an electronic device is disclosed. The electronic device includes a circuit board and an alternating current cable including one end connected to the circuit. The electromagnetic interference assembly includes an electromagnetic interference shielding plate. The circuit board is mounted on the electromagnetic interference shielding plate. The alternating current cable includes a segmental portion arranged adjacent to the electromagnetic interference shielding plate. The segmental portion extends substantially parallel to the electromagnetic interference shielding plate. The electromagnetic interference shielding plate defines a plurality of slots each extending in a direction perpendicular to an extending direction of the segmental portion of the alternating current cable. The parallel slots, as a whole, extend along the extending direction of the segmental portion and spatially corresponding to the segmental portion.

7 Claims, 2 Drawing Sheets

ELECTROMAGNETIC INTERFERENCE SHIELDING ASSEMBLY AND ELECTRONIC DEVICE HAVING SAME

BACKGROUND

1. Technical Field

The present disclosure relates to electromagnetic interference shielding assemblies, and particularly, to an electromagnetic interference shielding assembly and an electronic device including the electromagnetic interference shielding assembly.

2. Description of Related Art

Electromagnetic interference (EMI) is a serious and challenging problem for most electronic devices or systems. As EMI disturbances commonly interrupt, degrade or limit the effective performance of the electronic device or the whole circuit of the electronic system, it is necessary for the electronic devices or systems to have efficient EMI protection to ensure the effective and safe operation.

BRIEF DESCRIPTION OF THE DRAWINGS

Many aspects of the present disclosure should be better understood with reference to the following drawings. The units in the drawings are not necessarily drawn to scale, the emphasis instead being placed upon clearly illustrating the principles of the present disclosure. Moreover, in the drawings, like reference numerals designate corresponding portions throughout the several views.

DETAILED DESCRIPTION

Embodiments of the present disclosure will now be described in detail, with reference to the accompanying drawings.

Figure 1:
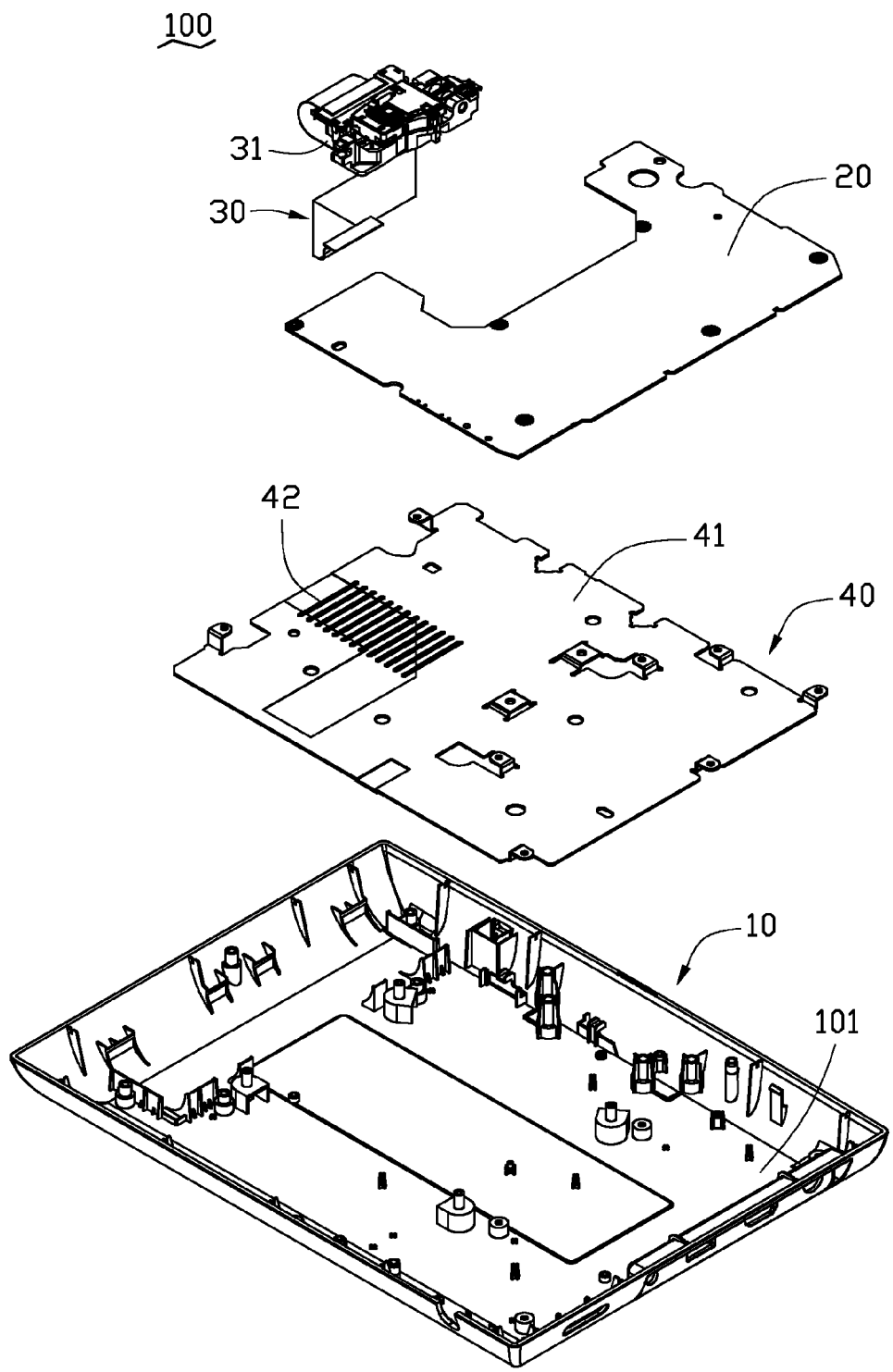
FIG. 1 is an exploded, isometric view of an electronic device in accordance with an exemplary embodiment.
Figure 2:
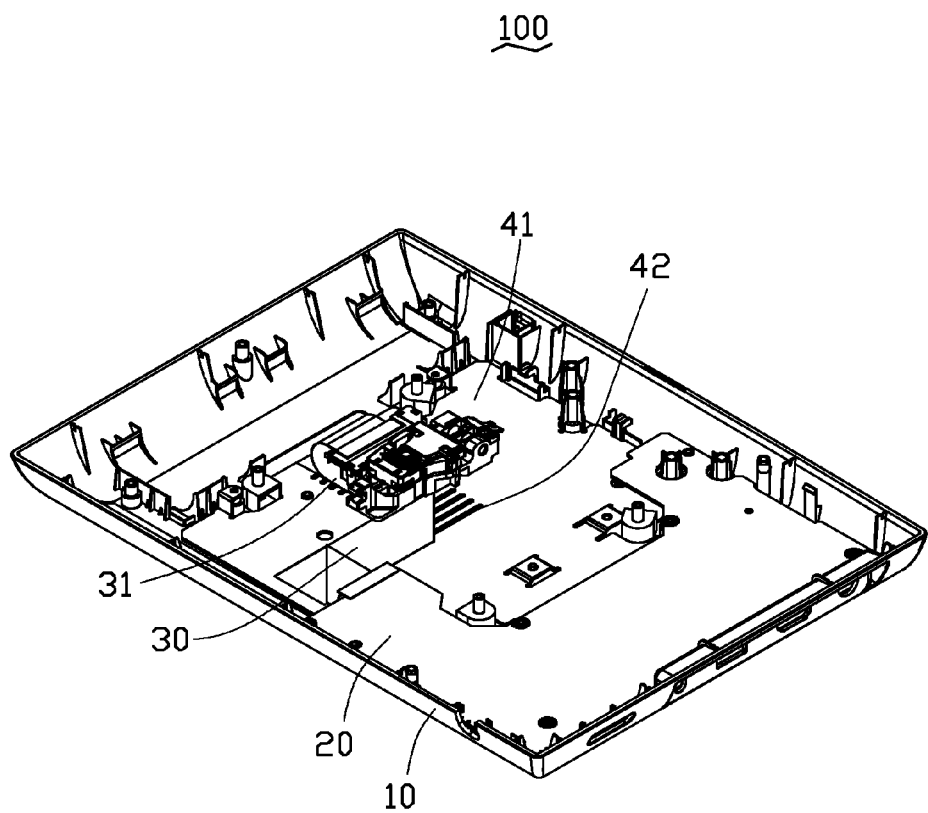
FIG. 2 is an assembled perspective view of the electronic device show in FIG. 1.

FIGS. 1-2 are isometric views of an exemplary embodiment of an electronic device 100. The upper cover has been omitted for clarity. The electronic device 100 includes a bottom cover 10 defining a receiving space 101 for receiving a circuit board 20, an alternating current cable 30 including one end connected to the circuit board 20, and an electromagnetic interference shielding assembly 40.

In this embodiment, the circuit board 20 includes a number of electronic components (not shown) and a number of connection interfaces (not shown). The alternating current cable 30 connects the electronic components and/or other circuit boards to the circuit board 20. In this embodiment, the alternating current cable 30 is a flexible flat cable (FFC). In an alternative embodiment, the alternating current cable 30 may be a flexible flat circuit.

The electromagnetic interference shielding assembly 40 includes an electromagnetic interference shielding plate 41 which is mounted on the inner surface of the bottom cover 10. The circuit board 20 is mounted on the electromagnetic interference shielding plate 41. In this embodiment, the electromagnetic interference shielding plate 41 is a metallic plate. In this embodiment, the alternating current cable 30 includes a segmental portion 31 arranged adjacent to the electromagnetic interface shielding plate 41, and the segmental portion 31 extends substantially parallel to the electromagnetic interference shielding plate 41. The electromagnetic interference shielding plate 41 further defines a number of slots 42 each extending in a direction substantially perpendicular to the extending direction of the segmental portion 31 of the alternating current cable 30. The parallel slots 42, as a whole, extending along the extending direction of the segmental portion 31 and vertically aligned with the segmental portion 31.

The alternating current flowing in the alternating current cable 30 may induce magnetic field around the alternating current cable 30, and the assembly 40 is in the range of the induced magnetic field. The induced magnetic field may further induce alternating current in the electromagnetic interference shielding plate 41, and the direction of the induced alternating current in the electromagnetic interference shielding plate 41 is the same as the alternating current in the segmental portion 31 of alternating current cable 30, that is, the direction of the alternating current is along the extension direction of the segmental portion 31. However, because the extension direction of each slot 42 is perpendicular to the segmental portion 31, the direction of the induced alternating current in the electromagnetic interference shielding plate 41 is changed to flow along the interspaces between the slots 42. That is, the direction of the induced alternating current flowing in the electromagnetic interference shielding plate 41 is changed to be perpendicular to the extension direction of the segmental portion 31. Thus, the magnetic filed induced by the induced alternating current in the assembly 40 cannot be added to the magnetic filed induced by the alternating current on the segmental portion 31, and the electromagnetic interference will not be increased.

In this embodiment, the width of the elongated slots 42 is less than the wavelength of the radio waves generating electromagnetic interference to the electronic device 100, such that the electromagnetic wave cannot pass through the assembly 40.

It is to be understood, even though information and advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. An electromagnetic interference shielding assembly for use in an electronic device, the electronic device comprising a circuit board and an alternating current cable comprising one end connected to the circuit, the electromagnetic interference assembly comprising an electromagnetic interference shielding plate, the circuit board being mounted on the electromagnetic interference shielding plate, the alternating current cable including a segmental portion arranged adjacent to the electromagnetic interference shielding plate, the segmental portion extending substantially parallel to the electromagnetic interference shielding plate, the electromagnetic interference shielding plate defining a plurality of slots, the slots being parallelly arranged and each extending in a direction perpendicular to an extending direction of the segmental portion of the alternating current cable, the parallelly arranged slots arraying along the extending direction of the segmental portion and spatially corresponding to the segmental portion.

2. The electromagnetic interference shielding assembly as described in claim 1, wherein a width of each of the slots is less than a wavelength of radio waves that generate electromagnetic interference to the electronic device.

3. The electromagnetic interference shielding assembly as described in claim 1, wherein the electromagnetic interference shielding plate is a metallic plate.

4. An electronic device, comprising:
a bottom cover defining a receiving space;
a circuit board received in the receiving space;
an alternating current cable comprising one end connected to the circuit board; and
an electromagnetic interference shielding assembly comprising an electromagnetic interference shielding plate disposed between the bottom cover and the circuit board, the alternating current cable including a segmental portion arranged adjacent to the electromagnetic interference shielding plate, the segmental portion extending substantially parallel to the electromagnetic interference shielding plate, the electromagnetic interference shielding plate defining a plurality of slots, the slots being parallelly arranged and each extending in a direction perpendicular to an extending direction of the segmental portion of the alternating current cable, the parallelly arranged slots arraying along the extending direction of the segmental portion and vertically aligned with the segmental portion.

5. The electronic device as described in claim 4, wherein a width of each of the slots is less than a wavelength of a radio wave that generates electromagnetic interference to the electronic device.

6. The electronic device as described in claim 4, wherein the alternating current cable is flexible flat cable.

7. The electronic device as described in claim 4, wherein the alternating current cable is flexible flat circuit.

* * * * *